US008428278B2

(12) United States Patent
Lastrucci

(10) Patent No.: US 8,428,278 B2
(45) Date of Patent: Apr. 23, 2013

(54) IMPROVEMENTS TO SYSTEMS FOR ACOUSTIC DIFFUSION

(76) Inventor: Claudio Lastrucci, Florence (IT)

( * ) Notice: Subject to any disclaimer, the term of this patent is extended or adjusted under 35 U.S.C. 154(b) by 1082 days.

(21) Appl. No.: 12/376,837

(22) PCT Filed: Aug. 10, 2006

(86) PCT No.: PCT/IT2006/000615
§ 371 (c)(1), (2), (4) Date: Feb. 9, 2009

(87) PCT Pub. No.: WO2008/018099
PCT Pub. Date: Feb. 14, 2008

(65) Prior Publication Data
US 2010/0172516 A1 Jul. 8, 2010

(51) Int. Cl.
*H03G 3/00* (2006.01)

(52) U.S. Cl.
USPC .......... 381/107; 381/96

(58) Field of Classification Search .......... 381/96
See application file for complete search history.

(56) References Cited

U.S. PATENT DOCUMENTS

| | | | | |
|---|---|---|---|---|
| 2004/0170292 | A1* | 9/2004 | Vincenot | 381/350 |
| 2005/0031139 | A1* | 2/2005 | Browning et al. | 381/96 |
| 2005/0180587 | A1 | 8/2005 | Lopez Bosio et al. | |
| 2007/0086603 | A1* | 4/2007 | Lyon et al. | 381/96 |

FOREIGN PATENT DOCUMENTS

| | | | |
|---|---|---|---|
| DE | 196 36 414 | A1 | 3/1998 |
| EP | 0 508 392 | A2 | 10/1992 |
| EP | 1 351 543 | A2 | 10/2003 |
| EP | 1 401 239 | A3 | 3/2004 |
| EP | 1 513 372 | A2 | 3/2005 |
| JP | 59-90495 | | 5/1984 |
| JP | 59-112798 | | 6/1984 |
| WO | WO 00/21331 | | 4/2000 |
| WO | WO 00/35247 | | 6/2000 |

* cited by examiner

*Primary Examiner* — David Vu
*Assistant Examiner* — Jonathan Han
(74) *Attorney, Agent, or Firm* — McGlew and Tuttle, P.C.

(57) ABSTRACT

Described is a unit for amplifying and processing audio signals for driving an electro-acoustic transducer (D), comprising: an input for audio signals; a processor for audio signals (107); an output for a signal for driving said electro-acoustic transducer; and an input for at least one operating quantity of the electro-acoustic transducer. The audio-signal processor is programmed for setting a series of parameters defining a transducer to be emulated, the parameters of which define a model of the transducer to be emulated. The input audio signal is processed on the basis of said at least one operating quantity of the electro-acoustic transducer to obtain a behavior of the electro-acoustic transducer that emulates the transducer defined by said series of parameters set.

20 Claims, 8 Drawing Sheets

IMPROVEMENTS TO SYSTEMS FOR ACOUSTIC DIFFUSION

TECHNICAL FIELD

The present invention relates to improvements to devices for acoustic diffusion. More in particular, the present invention relates to improvements to the methodologies for power amplification, audio processing, and control of acoustic transducers.

STATE OF THE ART

A traditional audio amplification system, of a linear type, finds its theoretical maximum of conversion efficiency when the maximum of the output voltage and current are perfectly in phase (this occurs only in the case of purely resistive loads).

In amplification systems that operate in the conditions of electrical phase difference between output voltage and current there arise conditions of loss of efficiency, and in the case of purely reactive loads (real output power zero) the dissipation of the amplification device is maximum.

The combination of the electromechanical parameters that define a standard transducer has been optimized through many years of improvements in such a way as to obtain three clearly distinct results:

a) mechanical optimization of the transducer so as to obtain a set of suitable electromechanical parameters in standard acoustical loads;
b) electrical optimization of the transducer in such a way as to obtain a load (with regard to the electronic amplification system) as real as possible, with consequent moderate rotations of phase in the bandwidth of useful operation; and
c) electromechanical optimization of the transducer so as to obtain the maximum acoustic performance in a defined operating audio bandwidth.

As regards the efficiency of electro-acoustic conversion, the presence of a real part in the equivalent circuit of the transducer implies a loss of efficiency of the transducer and in the case of high powers of electrical-acoustic conversion sets a limit for thermal dissipation of the moving coil.

The construction of a transducer that maximizes the parameter $(B\cdot I)^2/R_e$ or that presents substantial reactive parts in the equivalent electromechanical model enables a significant increase in the efficiency and, other parameters being equal, increases the maximum value of the acoustic power that can be generated.

This type of transducer has for the amplifier a load with ample reactive parts and, from what has been said above, is not suitable where amplifiers of a linear type are used.

Switching amplifiers, in addition to presenting an extremely high efficiency on purely resistive loads even of low value, have the peculiar property of enabling a "re-cycling" of the reactive power transferred in the presence of partially or entirely reactive loads.

A transducer that maximizes the parameter $(B\cdot I)^2/R_e$ can thus be a load compatible for switching amplifiers with particular characteristics.

The use of a switching amplification stage enables acquisition of new degrees of freedom in the design of a more efficient transducer, which can be summed up in the following points:

1) possibility of reducing to an arbitrarily small value the coil resistance of the moving element of the transducer;
2) possibility of increasing arbitrarily the so-called "force factor" BI or in any case of increasing the ratio $(B\cdot I)^2/R_e$ up to the limits determined only by the magnetic materials and conductive materials so far available;
3) possibility of handling arbitrary phase relations between voltage and current required by the transducer device, until conditions of perfect quadrature (purely reactive loads) are achieved;
4) possibility of handling arbitrarily large masses of the moving element of the transducer, without necessarily jeopardizing the efficiency of the amplification system; and
5) possibility of handling arbitrarily small compliances of the suspensions of the transducer, without necessarily jeopardizing the efficiency of the amplification system.

However, a transducer made with the criterion of optimizing only the energy aspects presents considerable disadvantages in applicability in standard operating configurations.

OBJECT AND SUMMARY OF THE INVENTION

According to a first aspect, an object of the present invention is to provide a power amplification module for driving an electro-acoustic transducer for acoustic diffusers that is particularly simple and practical to install.

Basically, according to the above aspect of the invention, an amplifying and processing unit for an acoustic transducer is provided, comprising a container for housing electronic components and an element for anchorage to the acoustic transducer. With an arrangement of this type, it is possible to provide the container in such a way that it has overall dimensions such as to enable housing thereof in the empty conical space of the mobile diaphragm of the acoustic transducer and preferably a cross section with a substantially circular development. In a particularly advantageous embodiment of the invention, the container of the amplifying and processing unit has a height smaller than the diameter of the cross section so as to occupy in an optimal way the empty space within the mobile diffusion diaphragm of the transducer.

In this way, on the one hand there is obtained an easy assembly and a high simplicity of intervention for removal and maintenance of the amplifier unit. On the other hand, said unit does not take up space of the diffuser that could affect in an unforeseeable way or in a way that is hard to foresee the acoustic performance of the diffuser itself. The front arrangement, in the mobile diaphragm of the transducer, moreover presents the advantage of exploiting the displacement of air caused by the mobile diffusion diaphragm for facilitating dissipation of the heat generated by the power components within the amplifier unit. For said purpose, according to an advantageous embodiment of the invention, a finning can be provided for facilitating dissipation of heat.

In an advantageous embodiment, the container comprises a front shell and a rear shell. Preferably, the rear shell can be fixed, stably to a support for the electro-acoustic transducer, whilst the front shell can be removable, for opening the container and carrying out possible interventions of repair, including total removal of the on-board electronics.

If the container is equipped with the amplifier unit in front of the mobile diffusion diaphragm, it is particularly useful to provide a through duct in said container, housed within which is a differential-pressure sensor, the signal of which can be used for controlling audio signal processing, as described more clearly hereinafter.

Preferably, the duct is substantially parallel to an axis of symmetry of the container and is preferably coaxial with the container so that it is also coaxial to the mobile diffusion diaphragm if the container is set coaxially to the mobile diaphragm itself.

Forming a subject of the invention is also an audio amplification system comprising an acoustic transducer and an amplifying and processing unit as defined above. By "acoustic transducer" is meant in general the ensemble constituted by the electromagnetic motor (coil-magnet) and by the membrane or other mobile member fixed to the coil and constituting the acoustic diffuser proper.

According to a different aspect, a purpose of the present invention is the construction of a system that will provide the possibility of obtaining a peculiar acoustic compensation.

Basically, according to this aspect, in a possible embodiment the invention envisages an audio signal-amplifying and processing unit, comprising: an input for audio signals; a processor for audio signals; an output for a signal for driving an electro-acoustic transducer; and an input for a differential-pressure signal between the front space and the rear space of said acoustic transducer. The differential-pressure signal is processed by the processor for correcting any possible acoustic distortions and for modifying the behavior also in the linear range via variation of the electro-acoustic transducer driving signal. By "processor" is meant in general an analog unit for processing audio signals or a microprocessor for processing digital audio signals (DSP).

The subject of the invention is also an amplification system comprising a unit for amplifying and processing audio signals as defined above and an electro-acoustic transducer, comprising a differential-pressure sensor associated to said electro-acoustic transducer, the signal of said differential-pressure sensor being processed for correcting any possible distortions and adapt its acoustic performance via variation of the output signal of the amplifier unit.

According to a further aspect, a purpose of the present invention is to provide a new system of diffusion which will enable programming of an electro-acoustic transducer so that this may, for example, be driven by a switching amplifier and that may at the same time be applicable in standard operating configurations.

According to said aspect, in an advantageous embodiment, the invention envisages an for audio signal-amplifying and processing unit for driving an electro-acoustic transducer, said unit comprising: an input for audio signals; a processor for audio signals; an output for a signal for driving said electro-acoustic transducer; and an input for at least one operating quantity of the electro-acoustic transducer. According to the invention, the processor for audio signals is programmed for setting a series of parameters defining a transducer to be emulated, said parameters defining a model of the "target" transducer, i.e., the transducer to be emulated. In addition, the input audio signal is processed on the basis of said at least one operating quantity of the electro-acoustic transducer to obtain a behavior of the electro-acoustic transducer that emulates the transducer defined by said series of parameters set.

The operating quantity of the transducer can be one of the following: the output voltage of the amplifier unit; the output current of the amplifier unit; the temperature of the transducer; and the differential pressure between the front space and rear space of the transducer. In practice, more than one quantity will be used, for example the output voltage and the output current of the output stage of the amplifier, or the temperature of the transducer and the differential pressure, measured for example via a differential-pressure sensor set on the transducer as described previously.

According to an advantageous embodiment of the invention, the amplifying and processing unit comprises a feedback loop on the speed of the mobile diaphragm of the transducer and a control loop on the differential pressure.

Forming a subject of the invention is also an amplification system comprising an audio signal amplifying and processing unit as defined above and an electro-acoustic transducer, comprising at least one sensor of an operating quantity of the transducer, associated to said electro-acoustic transducer.

Further advantageous features and embodiments of the invention are set forth in the annexed claims and described in what follows with reference to a non-limiting example of embodiment of the invention.

BRIEF DESCRIPTION OF THE DRAWINGS

The present invention will be bitter understood following the description and the attached drawings, which show a practical non-limiting embodiment of the invention. More in particular in the drawings.

DETAILED DESCRIPTION OF AN EMBODIMENT OF THE INVENTION

Figure 1A:
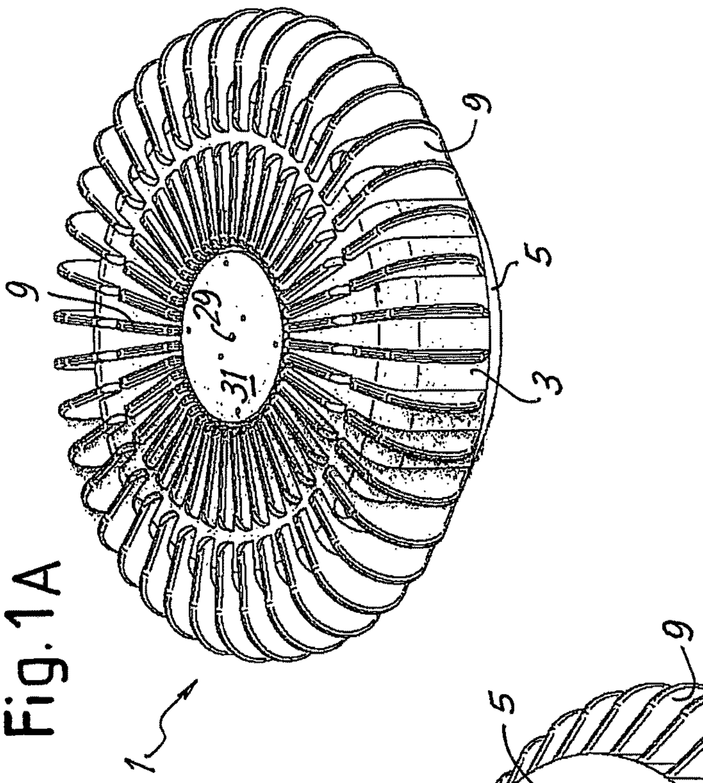
FIGS. 1A and 1B show, respectively, a front axonometric view and a rear axonometric view of the amplifying and processing unit according to the invention.
Figure 1B:
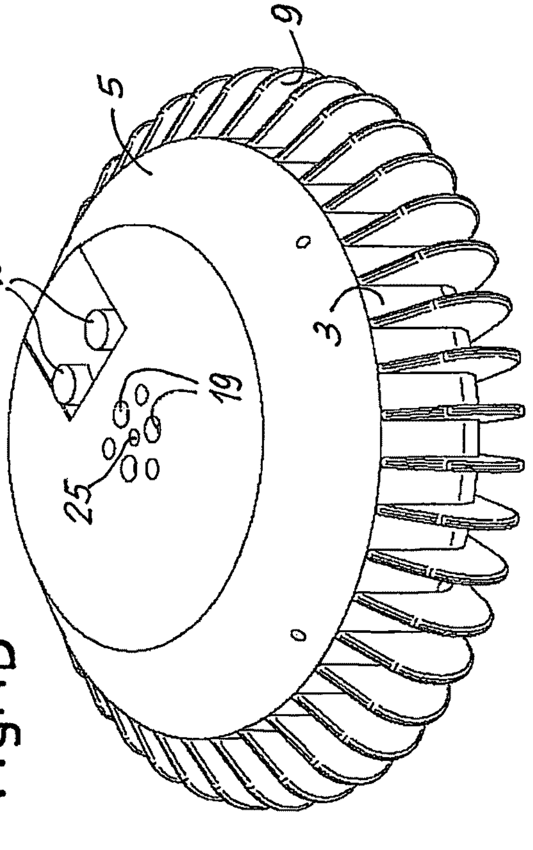
Figure 2:
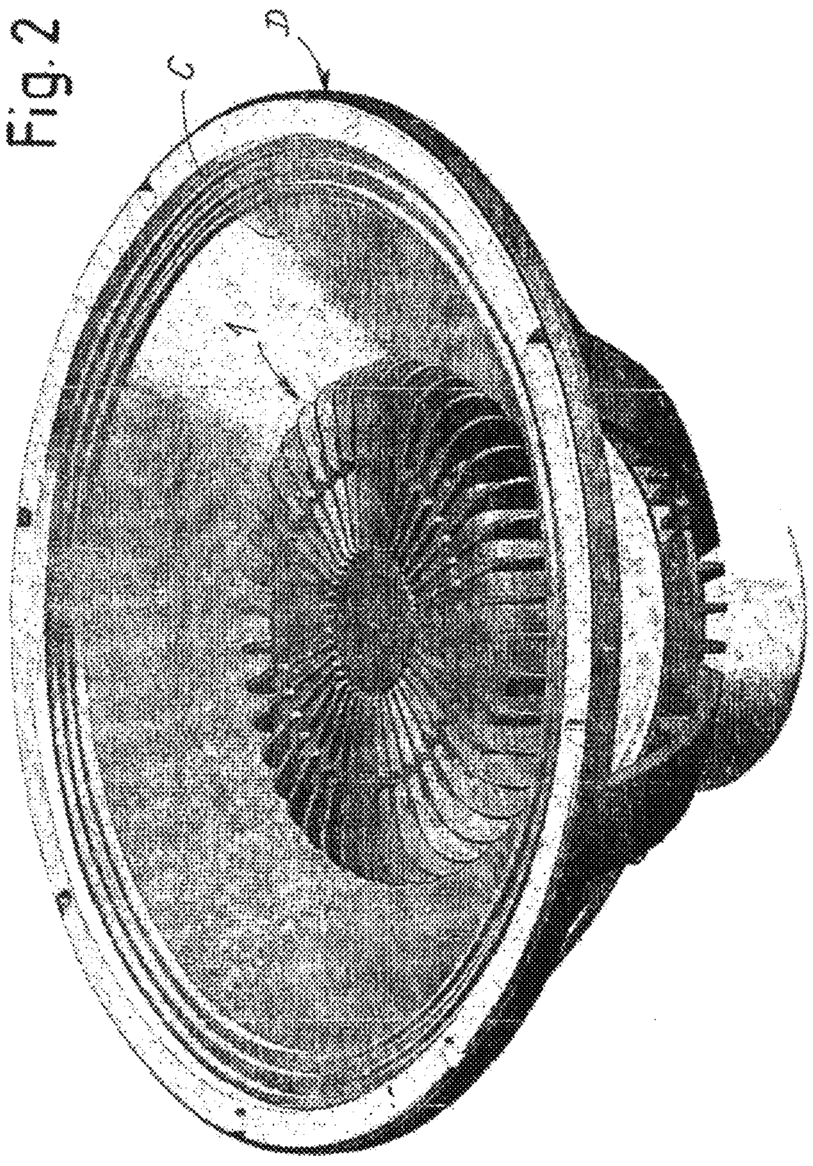
FIG. 2 shows an axonometric view of the unit mounted on an acoustic transducer.

With initial reference to FIGS. 1 to 5, the structure of the amplifying and processing unit associated to an acoustic transducer and the modalities of application to the transducer will first be described. The unit is designated as a whole by 1 and, according to an advantageous embodiment, is applied within the hollow conical space delimited by the mobile diaphragm or cone C of an acoustic diffuser D.

The unit 1 is enclosed within a housing or container delimited by a front shell 3 and by a rear shell 5, joined to one another (FIG. 4) by means of screws 7 provided, in adequate number, for example four, around the perimetral development of the container 3, 5. The container has a substantially axisymmetrical development, and the axis of symmetry is designated by A-A. Arranged on the front shell 3 are cooling fins 9, which have a radial development with respect to the axis A-A. The fins 9 have the purpose of dissipating the heat generated by the electronic components, especially by the electronic power components, housed within the container 3, 5, designated as a whole by 11 and mounted, together with the logic components, on the electronic board 13.

Made on the rear shell 5 are cable-lead holes 15 for running electrical-supply cables (not shown) and cables for the audio signals that are to be amplified and processed by the unit 1. The cables are connected to electrical contacts provided, for example, on a board 17 stably mounted on the rear shell 5, co-operating with which are electrical contacts (not illustrated) made on the board 13. In an advantageous embodiment the electrical contacts are of the plug-in type so that the board 13 with the electronic components mounted thereon can be slid easily out of the housing, once the front shell 3 has been removed by unscrewing the screws 7, whilst the board 17 remains constrained to the rear shell, which in turn is fixed to the diffuser D in the way described hereinafter. Removal of the electronic components is thus rendered particularly simple.

Figure 3:
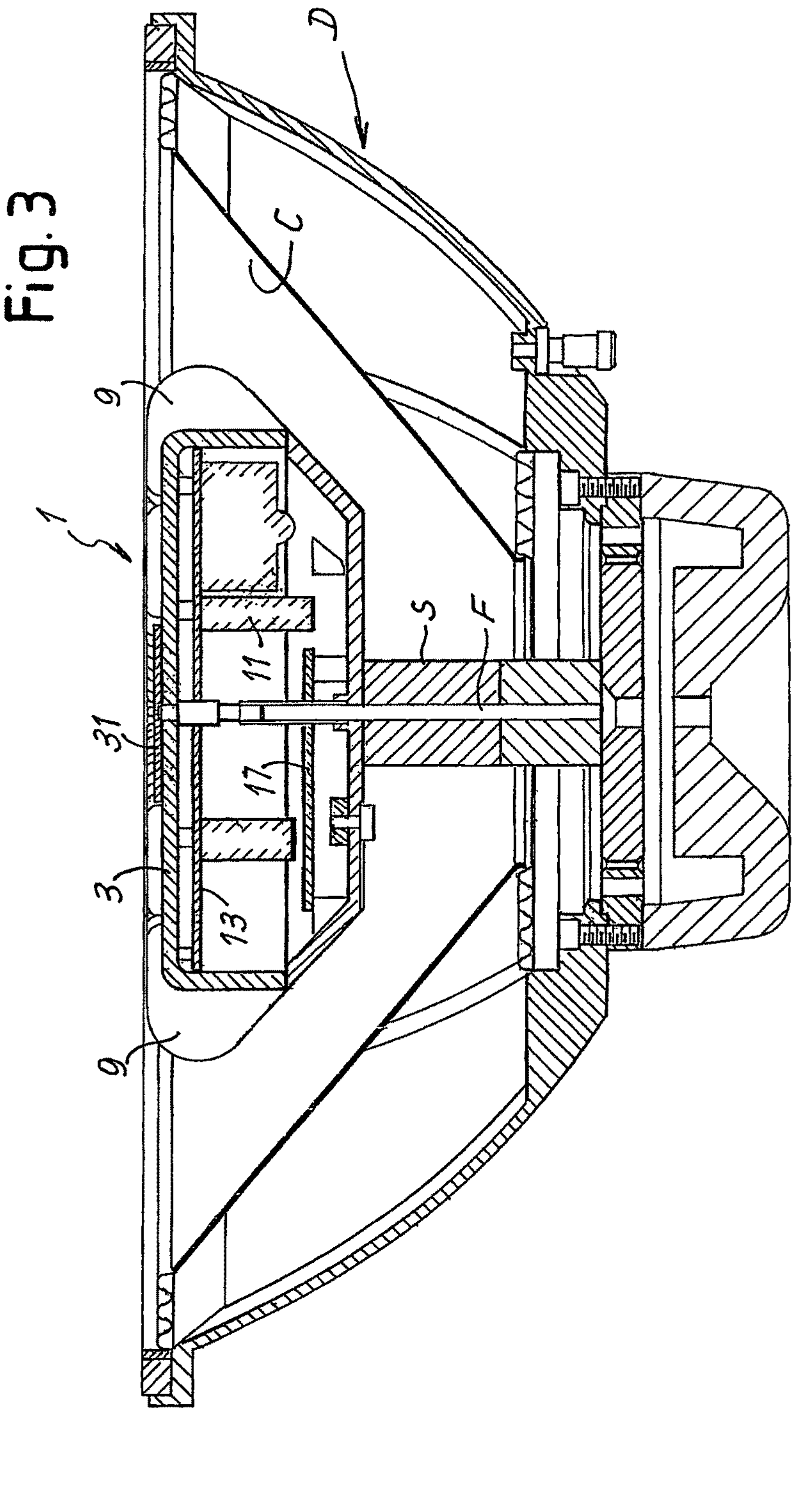
FIG. 3 shows a cross-sectional view of the unit mounted on the acoustic transducer.
Figure 4:
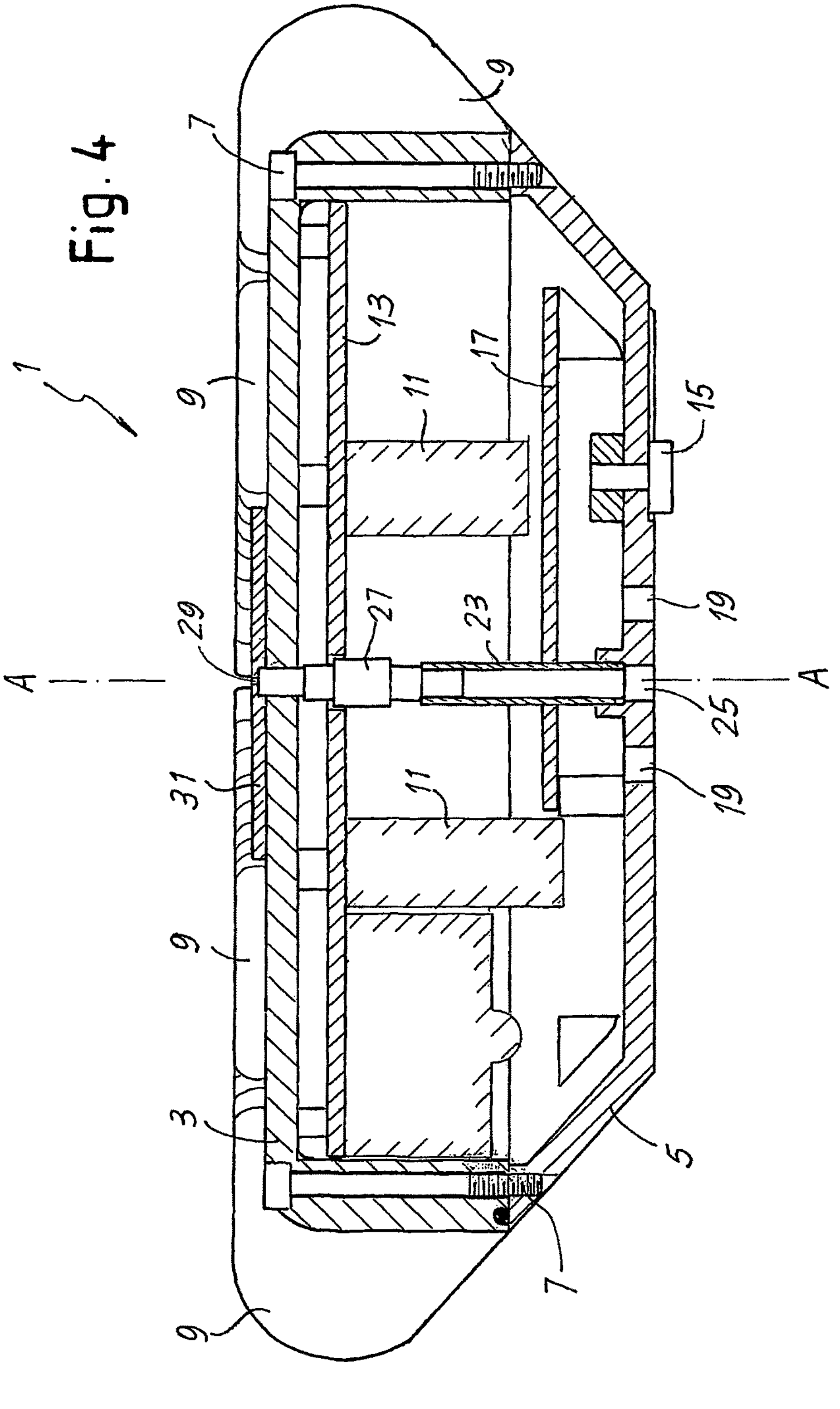
FIG. 4 shows a schematic enlargement of the cross section of the amplifying and processing unit.
Figure 5:
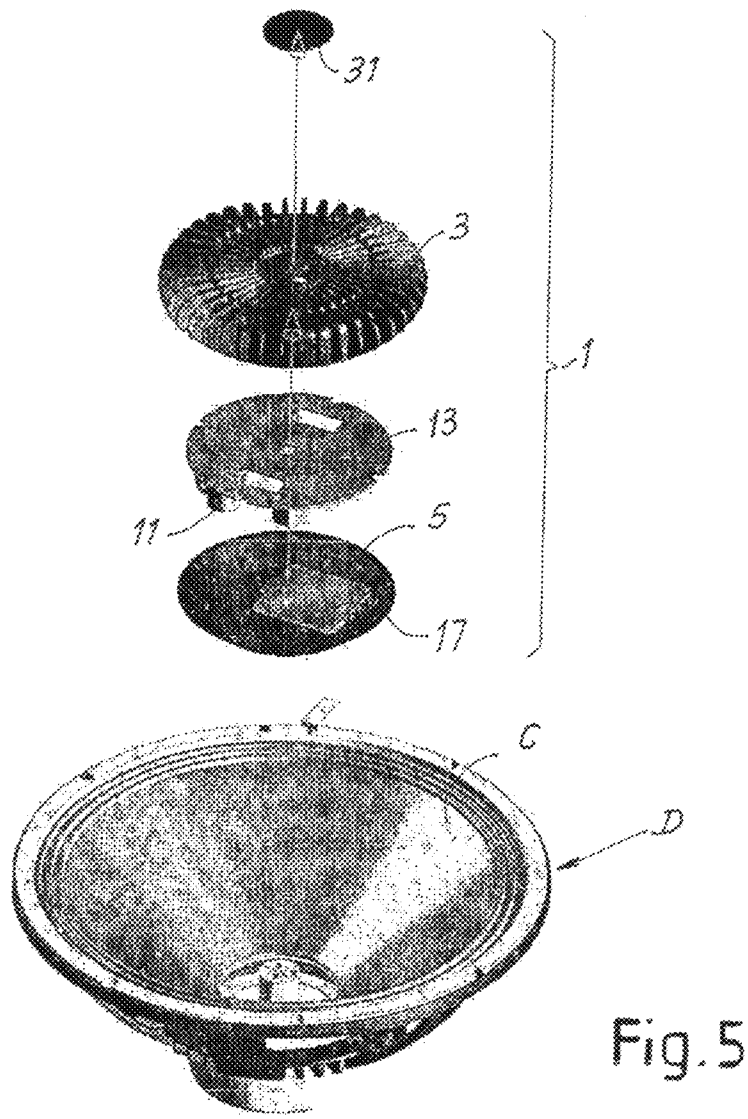
FIG. 5 shows an exploded view of the unit and its positioning with respect to the transducer and the various functional mechanical parts associated thereto.

The rear shell 5 is fixed via screws (not shown), which are inserted into through holes 19 made in the rear shell and are engaged in threaded holes made at the front in a support S in the form of column fixed to the transducer D (FIG. 3).

The support S has a through hole F, which gives out at the rear of the transducer D and which, when the unit 1 is mounted on the transducer D, is aligned to a duct 23 housed within the container 3, 5, with one end inserted in a through hole 25 made in the rear shell 5. Inserted in the duct 23 is a differential-pressure sensor 27, which communicates, through the duct 23 and the hole F, with the rear space of the diffuser D. At the front, the differential-pressure sensor 27 is in communication with the front space through a front hole 29 made in a lid 31 screwed on the front shell 3. In this way, acting on the differential-pressure sensor 27 is the pressure generated in front of and behind the diffuser D on account of the sound waves generated by the diffuser itself.

The differential-pressure sensor 27 is able to generate a signal that is a function of this pressure difference, which can be used for the purposes and in the ways described hereinafter. In the preferred embodiment illustrated herein, the pressure sensor 27 is coaxial to the diffuser S; i.e., it lies substantially on the axis of the conical mobile diaphragm C of the transducer. It should be understood, however, that, even though this is the optimal configuration, it is not strictly indispensable. In general, it is possible to set the differential-pressure sensor 27 approximately in the central area of the transducer, for example inside a cylindrical space coaxial to the diffuser with a radius equal to or smaller than the smaller base of the mobile diaphragm C, or else even in the space defined by the cylinder sharing the axis of the mobile diaphragm C and having a diameter equal to the maximum diameter of the mobile diaphragm itself. Set around the support S that extends approximately coaxially with respect to the mobile diaphragm C are the magnet and the moving coil, not shown and known per se.

In the configuration illustrated herein it is envisaged to house all the electronic components—including the differential-pressure sensor—in a housing or container set in the internal space of the mobile diaphragm of the transducer D. This arrangement of the amplifying and processing unit 1 is particularly advantageous in so far as it enables exploitation of a space of the transducer that is normally unused, with a further advantage of ease of accessibility for assembly and disassembly for example in the case of repair. Dissipation of the heat generated by the electronic power components is facilitated by the same movement of air brought about by the movement of the mobile diaphragm or other mobile member of the transducer, since this flow of air impinges directly upon the cooling fins 9. It should on the other hand be understood that the advantages of a differential-pressure sensor can be exploited also with a different assembly of the unit 1, for example at the back with respect to the transducer D, as likewise the advantages of the unit 1 set at the front of the diffuser in the space of the mobile diaphragm (typically a cone or another type of mobile member) can be exploited even in the absence of a differential-pressure sensor.

Figure 6:
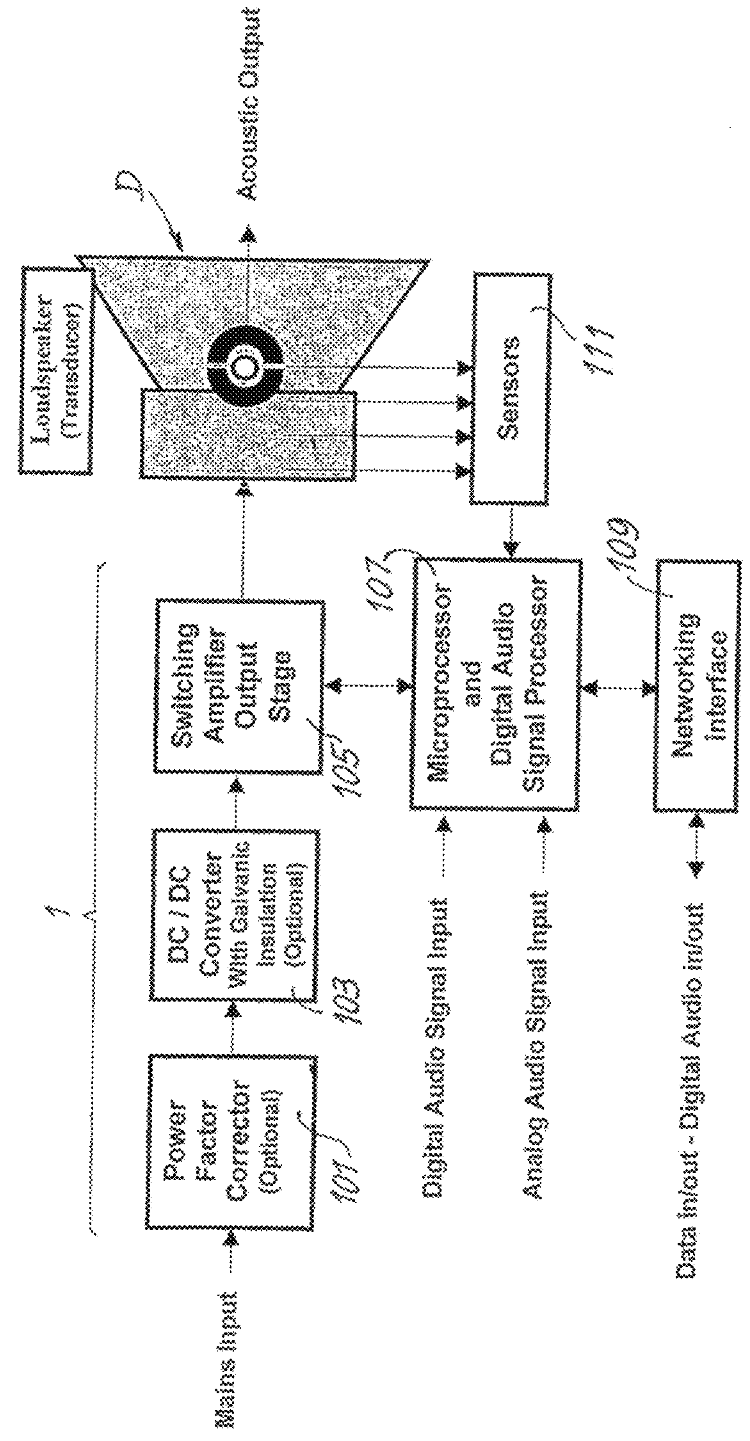
FIGS. 6 to 8 show functional diagrams of the amplifier and of the transducer for a description of the parameterization and programming criteria.

From an electronic and electromechanical standpoint, the system constituted by the amplifying and processing unit 1 and by the diffuser or electro-acoustic transducer D may be illustrated schematically by the block diagram of FIG. 6, represented in which are the electro-acoustic transducer or diffuser D and the unit 1 comprising: an optional block 101 for correction of the power factor, connected to the electrical mains supply; a converter; a DC/DC converter represented by block 103 with an optional galvanic insulation; an output stage 105 of a switching amplifier with its output in bridge or half-bridge configuration; a block 107 comprising a microprocessor and a digital-audio-signal processor; an interface 109; a set of sensors represented by block 111, included amongst which is the differential-pressure sensor 27 already recalled with reference to the previous figures.

According to an advantageous embodiment, block 107 has an input for digital audio signals and an input for analog audio signals, with an analog-to-digital converter (not shown) associated thereto in such a way that the amplifier may be supplied with a digital signal or with an analog signal.

Figure 7:
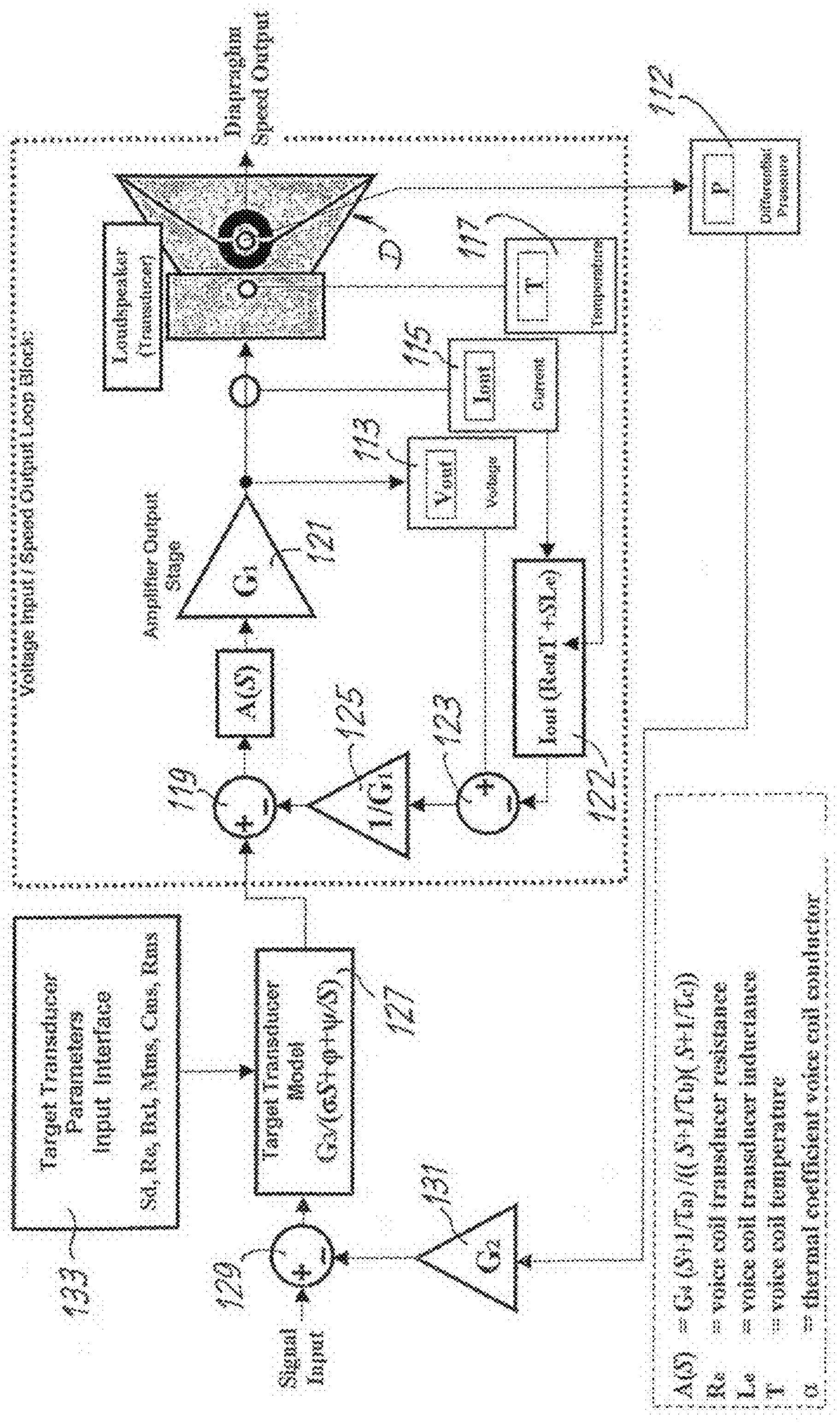

FIG. 7 illustrates a block diagram for parameterization of the electro-acoustic transducer D and emulation of a target transducer via definition of electro-acoustic parameters that characterize the behavior of the transducer itself.

Basically, as illustrated in FIG. 7, associated to the transducer D are, in addition to the differential-pressure sensor 27, here represented by block 112, further sensors for determining operating quantities of the transducer and in particular the supply voltage and current of the coil of the transducer D, schematically represented by blocks 113 and 115, as well as a temperature sensor 117, for detection of the temperature of the moving coil of the transducer D and/or of the acoustic diffuser associated thereto. In addition to the sensors represented herein, there could be associated to the transducer D sensors of position, speed and acceleration of the moving coil. Alternatively, the position, and hence the speed and acceleration, can be determined on the basis of the measurements of the other parameters (current, voltage) detected.

As a function of all or part of the quantities locally acquired or that can be calculated (voltage, current, pressure, temperature, position, speed and acceleration) it is possible to synthesize a set of electro-acoustic parameters (for example, Thiele-Small parameters) that define the behavior of a target transducer. Since the quantities required for determination of the electro-acoustic parameters are available in real time, it is possible to program the amplifier-transducer system so as to emulate a transducer of which for example the following virtual parameters will be set arbitrarily:

$S_d$: surface of the equivalent radiating piston;

$R_e$: resistance of the moving coil;

B·I: motive-power factor;

Mms: mobile mass of the moving element+acoustic mass coupled thereto;

Cms: compliance of the suspensions;

Rms: mechanical losses of the transducer.

Block 127 represents the model of the target transducer that is to be emulated, characterized by the parameters $S_d$, $R_e$, B·I, MmS, Cms, Rms defined above. The transfer function that represents the model of the target diffuser is indicated by $$G_3/(\sigma s+\phi+\psi/s),$$

where $G_3$ is the gain, s the variable of the transfer function, and σ, ϕ, and ψ are coefficients correlated to the parameters defining the target transducer. An input audio signal, for example coming from a pre-amplifier, is compared in a differentiator stage 129 with the signal coming from the differential-pressure sensor 112 appropriately amplified by an amplifier 131 with gain $G_2$ to obtain an error signal which, via the block 127, determines the input signal to a differentiator stage 119 of a control loop for control of the voltage of the output stage of the audio amplifier. Said loop schematically comprises, in addition to a differentiator stage 119 that receives at input an error signal and the driving signal coming from block 127 as described above, a feedback loop, which, from the signals coming from the sensors 115, 117, determines (block 122) a signal given by:

$$I_{out}(R_e\alpha T+sL_e)$$

where:

$I_{out}$ is the current supplied by the amplifier to the transducer D;

$\alpha$ is the thermal coefficient of the conductor of the moving coil of the transducer;

$R_e$ is the resistance of the coil;

$L_e$ is the inductance of the coil; and s is the variable of the transfer function.

The signal at output from block 122 is differentiated in a differentiator stage 123 with the voltage signal coming from the sensor 113, and the output signal of the differentiator stage 123 is amplified by an amplifier 125 having a gain $1/G_1$, the output of which is applied to the differentiator stage 119.

A(s) is the transfer function $$A(s)=G_4(s+1/\tau_a)/((s+1/\tau_b)(s+1/\tau_c))$$

where $G_4$ is the gain, and $\tau_{to}$, $\tau_b$, $\tau_c$ are time constants through which, from the output signal from the differentiator stage 119, there is determined the input signal of the output stage 121 of the amplifier the gain of which is designated by $G_1$. According to the embodiment illustrated, the error signal at input to the differentiator stage 119 is obtained by comparing the output voltage of the stage 121 with a signal given by the result of the product $(B\times l)V_{out}$, where B is the magnetic field of the magnet of the transducer and l is the length of the coil, corresponding to the estimation of the speed of the moving coil of the real transducer.

Consequently, a control loop has been obtained for controlling the voltage/speed of the coil. Other control modes are on the other hand possible, such as for example:

- the methodology of control via synthesis of a negative impedance equal to $-(R_e\alpha T+sL_e)$ in an active way englobed in the amplification block enables a similar performance to be obtained in terms of congruity between the input voltage of the amplifier with gain $G_1$ and the speed of the moving coil;
- the methodology of control via direct measurement of the speed of the moving coil by means of position, speed or acceleration sensors is also an alternative that can be pursued and is also widely described in the specific literature, but likewise presents disadvantages in terms of cost and complexity in so far as it requires a further sensor positioned adequately on the mobile parts of the transducer.

With the arrangement described, it is possible to set via a user interface (represented schematically by block 133) the electro-acoustic parameters of a target transducer to be emulated, and to generate, via the sensors 113, 115, 117, 112, and possibly other sensors of further quantities involved (such as position, speed and acceleration of the coil), a signal for driving the transducer that will correct any possible acoustic distortions and at the time same will enable emulation of operation of the target transducer set.

Integration in the unit 1 of a networking-interface block with one or more communication channels towards the outside (block 109, FIG. 6) enables, via an adequate communication protocol (serial, ethernet, infrared, radiofrequency or the like), in addition to programming of the amplifying and processing unit for setting the parameters of the target transducer, also the following functions:

a. monitoring of the operating parameters of the system amongst which: temperature of the amplification device; temperature of the transducer device; acoustic output level of the system; values of differential pressure on the transducer; supply voltage of the system; as well as all the other quantities available acquired by the control system;

b. transfer of data to the device for the following applications: firmware updating of the on-board processing devices; updating of the acoustic parameters of the reference model of the virtual transducer and of the acoustical load; updating of the electrical parameters of the equalization/filtering system and "off-loop" processing;

c. transfer of data to/from the device for the following applications: digital audio streaming for applications that envisage input of audio signals directly in the digital domain; and digital audio streaming for applications that require information regarding the behavior of the individual transducer in distributed systems of acoustic diffusion and correction; in said applications, the device can be used in a dual manner from the standpoint of active and passive transduction (emitter or receiver) and supply useful information as regards parameters of environmental acoustic compensation.

The detection of at least some of the operating quantities of the transducer (voltage, current, pressure, temperature, position, speed and acceleration) also enables an estimation of the active acoustic power irradiated by the transducer in the operating conditions under acoustical loading, and hence adaptation of the system constituted by the amplifying and processing unit and the electro-acoustic transducer to the environmental conditions in which it is set. Specifically, given that the efficiency of electro-acoustic conversion is considerably increased thanks to the use of a switching amplifier and to the specific electro-acoustically efficient construction of the associated transducer, it is possible to detect via the equivalent electrical model of the transducer also the acoustic parameters of the complete system. It is possible to render the amplifier unit-transducer system sensitive to the variations in the boundary conditions and adaptive to the various situations of positioning in the environment.

In conventional transducers, said performance is usually not practicable in so far as the quantities involved are very small and negligible as compared to the model of the transducer taken individually.

Integration of an audio-processing system via analog or digital methodologies enables also a local processing of the virtual transducer for combining the response thereof with other transducers associated to the complete acoustic-diffusion system, namely:

- filtering;
- equalization;
- delay;
- limitation regarding the dynamic capacities of the transducer (for example, maximum range);
- limitation regarding the heat capacities of the transducer (via possible synthesis of equivalent thermal model);
- limitation regarding the dynamic capacities of the amplification stage (for example, maximum voltage and maximum current);
- limitation regarding the heat capacities of the amplification stage (via possible synthesis of equivalent thermal model).

It should be noted that the aforesaid control methodology is not necessarily bound for its applicability to the simultaneous presence of a transducer specifically optimized for obtaining high efficiency of electro-acoustic conversion, but rather is suited to being in any case effective also with transducers of a conventional type.

Figure 8:
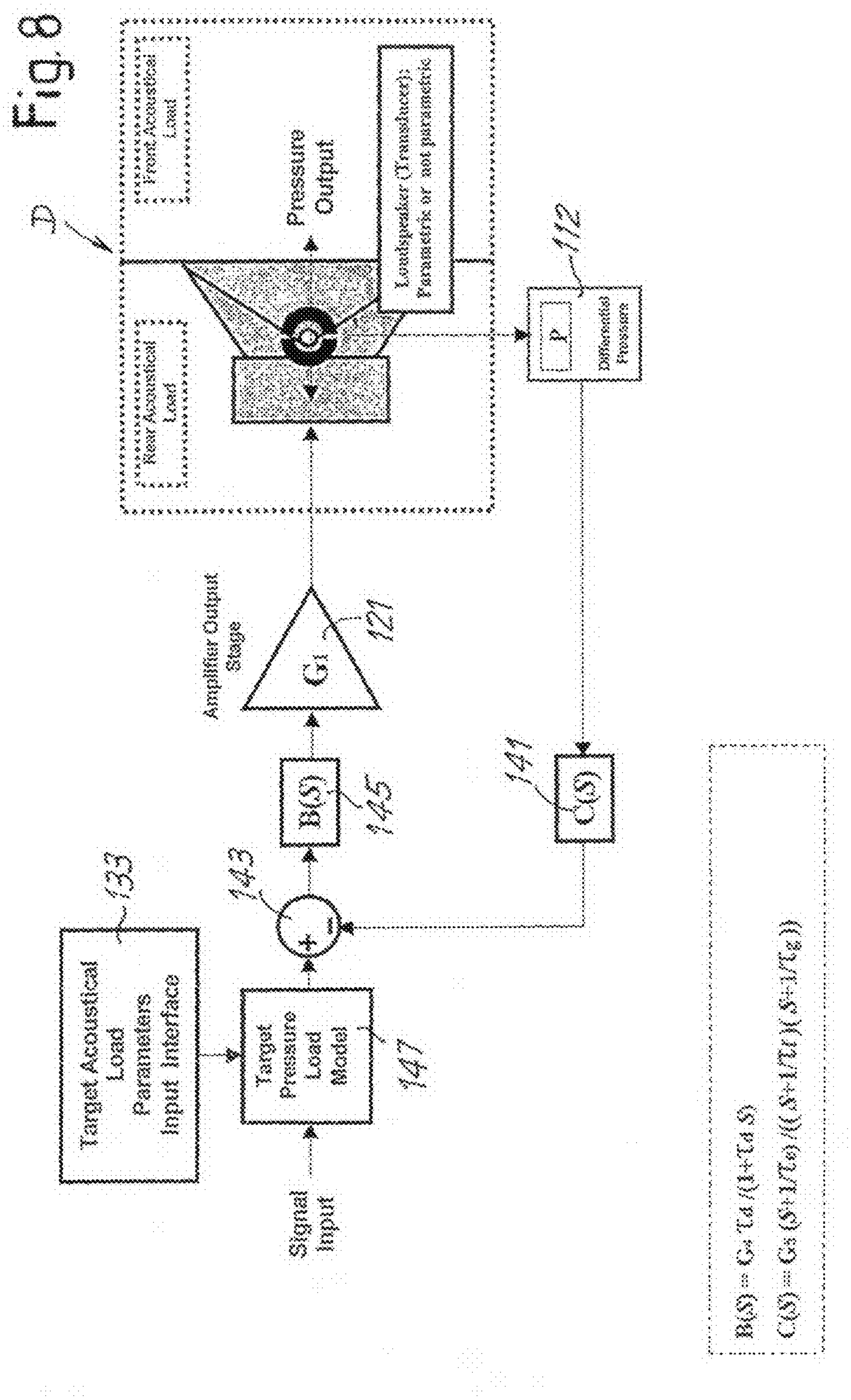

FIG. 8 illustrates a functional diagram of a further embodiment of the invention, which can be obtained in possible combination with the characteristics and functions illustrated with reference to FIG. 7. The same reference numbers designate parts that are the same as or equivalent to those of FIGS. 6 and 7. Specifically, FIG. 8 represents a diagram of a block for control of the acoustical load via detection of the differential pressure. The differential-pressure sensor 27 supplies (block 112) a signal that represents the difference between the pressure of the air in the front space and that in the rear space with respect to the diffuser D. Via a transfer function $$C(s)=G_5(s+1/\tau_e)/((s+1/\tau_f)(s+1/\tau_g))$$

where $G_5$ is the gain, and $\tau_e$, $\tau_f$ and $\tau_g$ are time constants, in block 141 a feedback signal is determined, which, compared via a differentiator stage 143 with an input signal, supplies an error signal. Via a transfer function of the control loop (block 145)

$$B(s)=G_4\tau_d/(1+\tau_d s)$$

where $\tau_d$ is a time constant and $G_4$ the gain, from the signal at output from the differentiator stage 143 the signal for driving the output stage 121 is obtained. The signal at input to the differentiator stage 143 is given by the audio signal, coming for example from a preamplifier, applied to the pressure model of the acoustical load set (block 147) defined via parameters set (via the interface 133) by the user.

The definition of the target equivalent-pressure model can be performed resorting to various methodologies:

- via standard analytical methods that refer to the target acoustical model, for the cases in which it is practicable in terms of simplicity;
- via methods of direct measurement of the differential pressure of a desired conventional reference acoustical system;
- via iterative methods of definition and verification of the desired acoustical result using a direct measurement of the acoustical result via the conventional methodologies of measurement.

With the control system schematically shown in FIG. 8 it is thus possible for the user to program the amplifying and processing unit so that it will drive the transducer D to obtain a given load of differential acoustic pressure, defined by the model characterized in block 147. The differential-pressure sensor generates a signal, which, processed as described above, supplies a signal that is a function of the differential pressure actually acquired via the sensor; and hence via differentiation in block 143 it is possible to generate an error signal with which to drive the output stage of the amplifier 121 for controlling any possible distortions and incongruities between the output pressure signal and the reference model represented in block 147.

In practice, the differential-pressure measurement enables control of the non-linearities of the acoustical load and of the transducer used and a compensation to be obtained regarding the phase and magnitude response of the transducer/diffuser system to obtain acoustically adaptive systems. The differential-pressure transducer moreover enables a control strategy to be obtained such as to enable the transducer to react to the acoustic boundary conditions in a way congruous with the target acoustical reference model.

It should be noted that the differential-pressure sensor 27 (represented schematically in FIGS. 7 and 8 by the functional block 112) is preferably aligned with the mobile diffusion diaphragm C of the transducer or diffuser D, but this condition is not indispensable for the implementation of the invention. The differential-pressure sensor can be set at a certain distance from the axis, maintaining at least in part its functionality. The admissible distance depends upon the range of audio frequencies of interest.

Furthermore, as mentioned above, the function of the control system of the differential pressure represented schematically in FIG. 8, which enables control of the differential acoustic pressure, can be implemented also with a different arrangement of the amplifying and processing unit 1, for example at a distance from the transducer D, setting on the latter only the sensor 27. This can occur, in a possible embodiment, by setting the sensor 27 in the through hole of the support S, which will have in this case the function of housing the differential-pressure sensor and not of support for the unit 1.

Once again, the microprocessor and the digital-audio-signal processor (block 107, FIG. 6) can be configured and programmed for implementing both parameterization of the quantities of the transducer and emulation of a target transducer, characterized by parameters (for example, Thiele-Small parameters) pre-defined by the user (as described with reference to FIG. 7), and control of the differential pressure with correction of the distortions and incongruities with respect to a reference model (as described with reference to FIG. 8). However, these two functions can also be implemented separately and independently of one another.

It is understood that the drawings merely show an exemplification provided only as practical arrangement of the invention, it being possible for said invention to vary in the forms and arrangements, without thereby departing from the scope of the idea underlying the invention. The possible presence of reference numbers in the attached claims has the purpose of facilitating reading thereof with reference to the description and to the plate of drawings, and in no way limits the scope of protection represented by said claims.

The invention claimed is:

1. An audio signal amplifying and processing unit, comprising:

an audio signals processor receiving audio signals and a differential-pressure signal as input, said audio signals processor providing an electro-acoustic transducer signal as output for driving an electro-acoustic transducer, said differential-pressure signal corresponding to a differential pressure between a pressure of a front space of the electro-acoustic transducer and a pressure of a rear space of the electro-acoustic transducer, wherein the differential-pressure signal is processed by said audio signals processor for correcting any possible distortions and incongruities regarding the reference acoustic system via variation of the electro-acoustic transducer signal for driving the electro-acoustic transducer.

2. A unit according to claim 1, further comprising an interface for entry of parameters defining a target acoustical load and means for defining a target equivalent-pressure model.

3. A unit according to claim 1, further comprising an input for at least one operating quantity of the electro-acoustic transducer, wherein said audio signals processor is programmed for setting a series of parameters defining a transducer to be emulated, said parameters defining a model of the transducer to be emulated, wherein said input audio signal is processed on the basis of said at least one operating quantity of the electro-acoustic transducer to obtain a behavior of the electro-acoustic transducer that emulates the transducer defined by said series of parameters set.

4. A unit according to claim 2, further comprising an input for at least one operating quantity of the electro-acoustic transducer, wherein said audio signals processor is programmed for setting a series of parameters defining a transducer to be emulated, said parameters defining a model of the transducer to be emulated, wherein said input audio signal is processed on the basis of said at least one operating quantity of the electro-acoustic transducer to obtain a behavior of the electro-acoustic transducer that emulates the transducer defined by said series of parameters set.

5. A unit according claim 3, wherein said quantity is selected from the group including: the output voltage of the amplifier unit; the output current of the amplifier unit; the temperature of the transducer; the differential pressure between the front space and the rear space of the transducer; the position of a mobile member of the acoustic transducer; the speed of the mobile member of the acoustic transducer; and the acceleration of the mobile member of the acoustic transducer.

6. A unit according to claim 3, further comprising an interface for entry of parameters defining a transducer to be emulated, and means for defining a model of said transducer to be emulated.

7. A unit according to claim 6, wherein said parameters are chosen from the group including: the surface of the equivalent radiating piston; the resistance of the moving coil; the motive-power factor; the mobile mass of the moving element and of the coupled acoustic mass; the compliance of the suspensions; and the mechanical losses of the transducer.

8. A unit according to claim 1, further comprising a feedback loop on the output voltage.

9. A unit according to claim 1, further comprising a control loop on the differential pressure.

10. A unit according to claim 1, further comprising a switching amplifier.

11. An amplification system comprising:

an electro-acoustic transducer comprising a front surface, a rear surface and a differential pressure sensor associated with said electro-acoustic transducer, said front surface and said rear surface defining a front volume and a rear volume, said differential pressure sensor detecting a differential pressure based on a pressure in said front volume and a pressure in said rear volume, said pressure sensor providing a differential-pressure signal as output, said differential-pressure signal corresponding to said detected differential pressure;

an audio signal amplifying and processing unit comprising:

an input for audio signals;

an audio signals processor;

an output for a signal for driving an electro-acoustic transducer; and an input for receiving said differential-pressure signal, wherein the differential-pressure signal is processed by said audio signals processor for correcting any possible distortions and incongruities regarding the reference acoustic system via variation of the signal for driving the electro-acoustic transducer, wherein said audio signal amplifying and processing unit is connected to said electro-acoustic transducer, said differential-pressure signal being processed for correcting any possible acoustic distortions via variation of the output signal of the audio signal amplifying and processing unit.

12. A system according to claim 11, wherein said differential-pressure sensor is positioned for detecting a differential pressure between a space at the front of a diffusing member of the acoustic transducer and a space at the rear of said diffusing member.

13. A system according to claim 12, wherein said diffusing member is a mobile diaphragm.

14. A system according to claim 12, wherein said differential-pressure sensor is positioned within a substantially cylindrical space, with an axis coinciding with an axis of the diffusing member and with a cross section of dimensions substantially corresponding to or smaller than dimensions of the diffusing member.

15. A system according to claim 14, wherein said differential-pressure sensor is arranged at a distance from the axis of the diffusing member that is less than a larger diameter of said diffusing member.

16. A system according to claim 15, wherein said differential-pressure sensor is arranged at a distance from the axis of the mobile diffusion diaphragm that is less than a smaller diameter of said mobile diffusion diaphragm.

17. The system according to claim 16, wherein said differential-pressure sensor is approximately coaxial to the mobile diaphragm of the transducer.

18. A system according claim 15, wherein said acoustic transducer comprises a support substantially coaxial to the acoustic transducer within which a through hole is made, there being applied to said support a container, in which said unit for amplifying and processing acoustic signals is placed, and inside which said differential-pressure sensor is housed, in a seat communicating with the outside world through said container and said through hole made in said support.

19. A system according to claim 11, further comprising at least one sensor of an operating quantity of the transducer, associated with said electro-acoustic transducer.

20. A system according to claim 11, wherein said differential-pressure sensor is arranged at a distance from an axis of the diffusing member.

* * * * *